United States Patent
Sato et al.

(10) Patent No.: US 11,934,022 B2
(45) Date of Patent: Mar. 19, 2024

(54) PHOTOELECTRIC FIBER AND COMMUNICATION DEVICE

(71) Applicant: Nippon Telegraph and Telephone Corporation, Tokyo (JP)

(72) Inventors: Norio Sato, Tokyo (JP); Atsushi Aratake, Tokyo (JP); Makoto Abe, Tokyo (JP); Takuya Tanaka, Tokyo (JP); Kota Shikama, Tokyo (JP); Takao Fukumitsu, Tokyo (JP); Hiroshi Ishikawa, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 266 days.

(21) Appl. No.: 17/626,979

(22) PCT Filed: Jul. 18, 2019

(86) PCT No.: PCT/JP2019/028298
§ 371 (c)(1),
(2) Date: Jan. 13, 2022

(87) PCT Pub. No.: WO2021/009912
PCT Pub. Date: Jan. 21, 2021

(65) Prior Publication Data
US 2022/0269020 A1    Aug. 25, 2022

(51) Int. Cl.
G02B 6/42   (2006.01)
H05K 1/11   (2006.01)
H05K 1/18   (2006.01)

(52) U.S. Cl.
CPC ......... *G02B 6/4284* (2013.01); *G02B 6/4253* (2013.01); *G02B 6/428* (2013.01); *H05K 1/11* (2013.01); *H05K 1/181* (2013.01)

(58) Field of Classification Search
CPC .... G02B 6/4284; G02B 6/4253; G02B 6/428; H05K 1/11; H05K 1/181
(Continued)

(56) References Cited

U.S. PATENT DOCUMENTS

| | | | |
|---|---|---|---|
| 9,335,496 B2* | 5/2016 | Ito | G02B 6/4249 |
| 9,869,832 B2* | 1/2018 | Jokura | G02B 6/4278 |
| 2013/0064499 A1* | 3/2013 | Satoh | G02B 6/4214 |
| | | | 385/14 |

FOREIGN PATENT DOCUMENTS

| | | |
|---|---|---|
| CN | 207301568 U | 5/2018 |
| JP | H1039162 A | 2/1998 |

(Continued)

OTHER PUBLICATIONS

Yue, et al., "Latest Industry Trend in Pluggable Optics", IEEE, 16th International Conference on Optical Communications and Networks (ICOCN), 2017, Sunnyvale, CA, USA, 3 pages.

*Primary Examiner* — Andargie M Aychillhum
(74) *Attorney, Agent, or Firm* — Slater Matsil, LLP

(57) ABSTRACT

A photoelectric fiber includes a fiber including a core through which light is guided; an electrical unit formed continuously with the fiber, the electrical unit being configured to house a photoelectric conversion chip including a photoelectric conversion element; and an external electrode formed on a front surface of at least one of the fiber or the electrical unit, wherein the photoelectric conversion chip is optically connected to the core and electrically connected to the external electrode.

13 Claims, 14 Drawing Sheets

(58) Field of Classification Search
USPC .......................................................... 361/783
See application file for complete search history.

(56) References Cited

FOREIGN PATENT DOCUMENTS

| | | |
|---|---|---|
| JP | 2000021222 A | 1/2000 |
| JP | 2005338308 A | 12/2005 |

* cited by examiner

PHOTOELECTRIC FIBER AND COMMUNICATION DEVICE

CROSS-REFERENCE TO RELATED APPLICATIONS

This application is a national phase entry of PCT Application No. PCT/JP2019/028298, filed on Jul. 18, 2019, which application is hereby incorporated herein by reference.

TECHNICAL FIELD

The present invention relates to a photoelectric fiber and a communication device and more specifically relates to a photoelectric fiber that includes a photoelectric conversion element at an end portion of a fiber for transmitting an optical signal and a communication device using the photoelectric fiber

BACKGROUND

In today's communication, fibers are used in response to a demand for increasing capacity. A communication device used for communication using a fiber has a configuration in which, for example, a digital signal processing unit that performs signal processing and an optical transceiver are connected on the printed circuit board.

In such a communication device, for example, as illustrated in FIG. 8, an LSI (integrated circuit) 1001 and a pluggable optical transceiver 1003 are provided on a printed circuit board 1002, and the two are connected by a high-frequency electrical wiring 1004. Here, the LSI 1001 constitutes a transceiver unit provided with a digital processing unit and a digital-to-analog conversion circuit that performs signal processing of the communication. The pluggable optical transceiver 1003 converts electrical signals input from LSI 1001 via the high-frequency electrical wiring 1004 into optical signals in the pluggable optical transceiver 1003 and sends the optical signals outside the printed circuit board 1002 via an optical fiber 1005. Also, the pluggable optical transceiver 1003 converts the optical signals received from the optical fiber 1005 into electrical signals and outputs the electrical signals via the high-frequency electrical wiring 1004 to the LSI 1001.

In the communication device illustrated in FIG. 8, there is a restriction on the band of the digital-to-analog conversion circuit of the LSI 1001 and the high-frequency electrical wiring 1004 on the printed circuit board 1002. Thus, a plurality of LSIs 1001 or pluggable optical transceivers 1003 are provided, enabling the overall transmission capacity to be increased via parallel processing.

Within the pluggable optical transceiver 1003, a photoelectric conversion element, such as a laser diode (LD) or a photodiode (PD), and a core of the optical fiber 1005 are optically joined. In connecting the photoelectric conversion element and the core of the optical fiber 1005, alignment accuracy within 1 micron or less is necessary in order to reduce optical insertion loss. For this reason, an engagement structure 1006 of a standard connector is often used. This increases the size of the pluggable optical transceiver 1003, relative to the LSI 1001, to a few cm square. Also, to lead the optical fiber 1005 to outside of the printed circuit board 1002, the pluggable optical transceiver 1003 is disposed on the peripheral edge portion of the printed circuit board 1002.

CITATION LIST

Non Patent Literature

NPL 1: Y. Yue et al., "Latest Industry Trend in Pluggable Optics", Int. Conf. Optical Communications and Networks, 2017.

SUMMARY

Technical Problem

However, the arrangement described above makes the distance connected by the high-frequency electrical wiring 1004 on the printed circuit board 1002 long, causing degradation of the electrical signals. In order to compensate for the deterioration, a circuit chip for performing waveform correction processing, such as reshaping, retiming, and regenerating, can be provided. However, when a waveform correction circuit chip is provided, the size of the LSI 1001 and the pluggable optical transceiver 1003 is made even larger. As a result, there is a problem in that the number of pluggable optical transceivers that can be connected to one LSI is limited, and the transmission capacity of the entire the communication device also reaches the limit.

Embodiments of the present invention are directed at reducing the size of an optical transceiver.

Means for Solving the Problem

To achieve the object described above, a photoelectric fiber (100) according to embodiments of the present invention includes:
- a fiber (101) including a core (102) through which light is guided;
- an electrical unit (110) formed continuously with the fiber, the electrical unit being configured to house a photoelectric conversion chip (113) including a photoelectric conversion element; and
- an external electrode (111) formed on a front surface of at least one of the fiber or the electrical unit, wherein the photoelectric conversion chip (113) is optically connected to the core and electrically connected to the external electrode.

Effects of Embodiments of the Invention

According to embodiments of the present invention, the photoelectric conversion element is provided at the end portion of the fiber, so it is possible to reduce the size of a transceiver that converts electrical signals into optical signals or converts optical signals received from the fiber into electrical signals. By reducing the size, the transceiver can be disposed in the vicinity of the LSI. Thus, high-frequency electrical signal wiring can be shortened and signal degradation can be prevented. Moreover, since a plurality can be arranged in parallel, it is possible to advantageously increase the transmission capacity of the entire communication device.

DETAILED DESCRIPTION OF ILLUSTRATIVE EMBODIMENTS

Hereinafter, embodiments of the present invention will be described with reference to the drawings.

First Embodiment

Figure 1A:
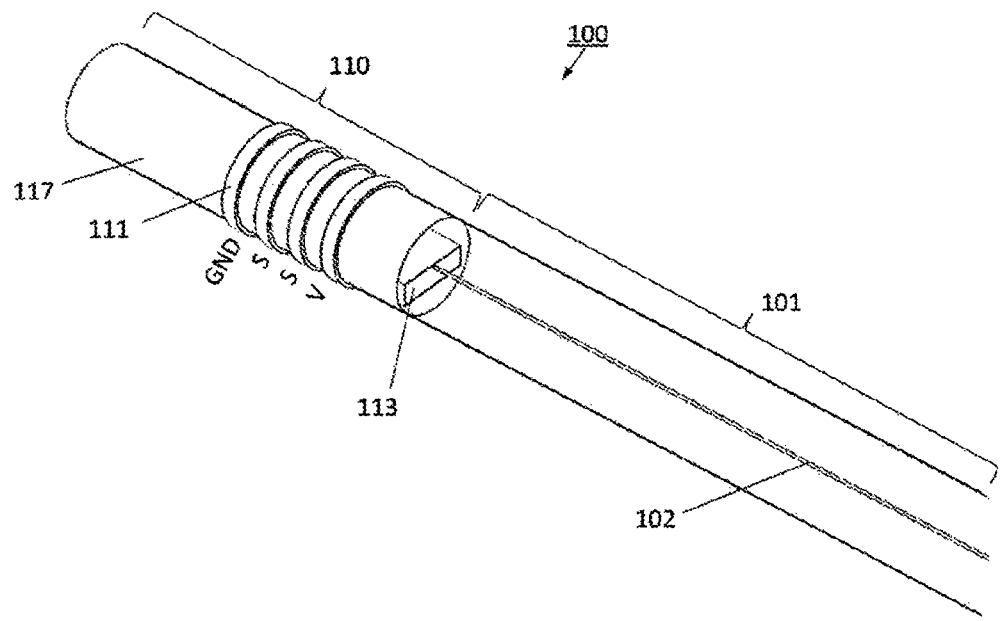
FIG. 1A is a diagram illustrating the configuration of a photoelectric fiber according to a first embodiment of the present invention.
Figure 1B:
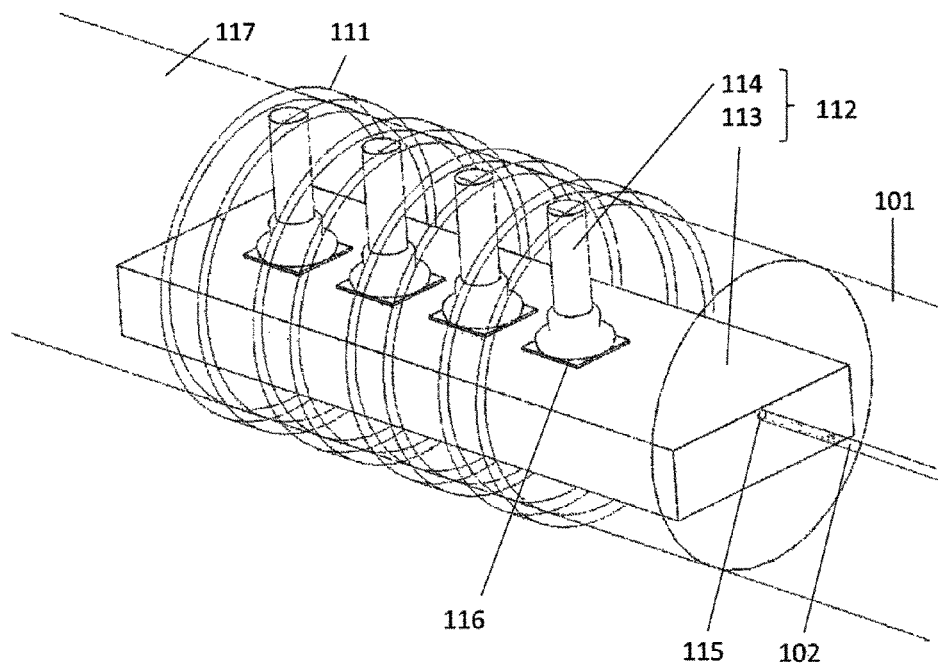
FIG. 1B is a diagram illustrating the configuration of the photoelectric fiber according to the first embodiment of the present invention.

The configuration of a photoelectric fiber according to the first embodiment of the present invention is illustrated in FIGS. 1A and 1B.

A photoelectric fiber 100 according to the present embodiment includes a fiber 101 including a core 102 in which light is guided, an electrical unit 110 formed continuously with the fiber 101, and an external electrode 11 formed on the front surface of the electrical unit 110.

Of these, the electrical unit 110 includes a photoelectric conversion chip (hereinafter referred to simply as "chip") 113 including a photoelectric conversion element, wiring 114 connecting the chip 113 and the external electrode 111, and a filling unit 117 that houses the chip 113 and the wiring 114.

In the present embodiment, in the chip 113, a photoelectric conversion element (not illustrated), such as a photodiode that converts an optical signal into an electrical signal or a laser diode that converts an electrical signal into an optical signal, and a drive circuit are formed. An electrode pad (hereinafter simply referred to as "pad") 116 that electrically connects to the external electrode 111 is formed on the top surface of the chip 113 formed in a rectangular parallelepiped shape. Regarding the number of pads, for example, if there are four terminals, two terminals are used for the electrical differential signal input and output from the external circuit and the remaining two terminals are used for the power supply and the ground, thus enabling power supply and signal processing. In a case where the chip 113 is formed from silicon and the power supply circuit is mixed, one power supply input may be converted to a plurality of potentials and used.

Figure 1C:
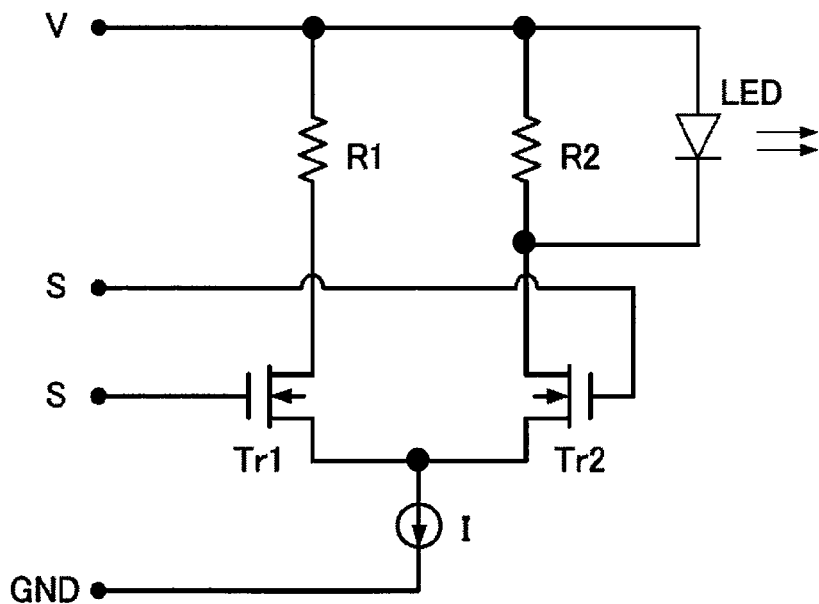
FIG. 1C is a diagram illustrating an example of a photoelectric conversion circuit of the photoelectric fiber according to the first embodiment of the present invention.

FIG. 1C illustrates an example of a photoelectric conversion circuit provided with a light-emitting diode (LED) as the photoelectric conversion element formed on the chip 113. The pad 116 is formed on the front surface of the chip 113 corresponding to four terminals, i.e., a power supply ground (GND), two differential signal lines (S), and a power supply (V).

Furthermore, an end surface (hereinafter referred to as "optical input/output unit") 115 of the optical waveguide serving as the input/output unit of the optical signals to the chip 113 is provided on the side surface of the chip 113.

Hereinafter, the chip 113 and the wiring 114 may be collectively referred to as a photoelectric conversion unit 112.

As illustrated in FIG. 1B, the electrical unit 110 includes the chip 113, the wiring 114 that electrically connects the pads 116 of the chip 113 and the external electrode 111, and a sealing member or the filling unit 117 that seals the chip 113 and the wiring 114. The filling unit 117 is made of an insulator and is formed in a cylindrical shape having approximately the same diameter as the fiber 101.

The above-described electrical unit 110 is provided at the end portion of the fiber 101 so as to be coaxial with the fiber 101. In this state, the core 102 of the fiber 101 and the optical input/output unit 115 of the chip 113 are aligned, and the core 102 of the fiber 101 is optically connected.

For example, the fiber 101 is a fiber with an outer diameter of 125 um including the cladding, and the electrical unit 110 also has a cylindrical shape with an outer diameter of approximately 125 um and a length of approximately 500 um. The chip 113 has a shape of 0.1 mm×0.3 mm×30 umt, and on the chip 113, four 30 um square pads 116 are disposed at a 50 um pitch. The chip 113 is, for example, a silicon photonics circuit, and is provided with PD using germanium or an LD in which a compound semiconductor adhered to a silicon substrate emits light. The wiring 114 is part of a bonding wire using gold. To make the cylindrical electrical unit 110 containing these, the filling unit 117 made of a resin fills the space.

The external electrode 111 is made of metal and is formed in an annular shape on the circumferential surface of the cylindrical electrical unit 110. The external electrode 111 is connected to the pad 116 of the chip 113 by the wiring 114. In the present embodiment, four external electrodes 111 for a power supply ground (GND), two differential signal terminals (S), and a power supply (V) are provided corresponding to the photoelectric conversion element formed on the chip 113 and the drive circuit thereof.

Operation and Use Example of Photoelectric Fiber

In the photoelectric fiber 100, light incident from the core 102 enters into a photoelectric conversion device, such as a photo detector, PD, or the like, from the optical input/output unit 115 of the chip 113 is output from the pad 116 as an electrical signal. Since the pad 116 is connected to the external electrode 111 via the wiring 114, the photoelectric-converted electrical signal can be led out via the external electrode 111.

Similarly, the electrical signals input from the external electrode 111 are output from the chip 113 as optical signals by a photoelectric conversion device (laser diode, LD) in the chip 113 and guided through the core 102 of the fiber 101.

Figure 1D:
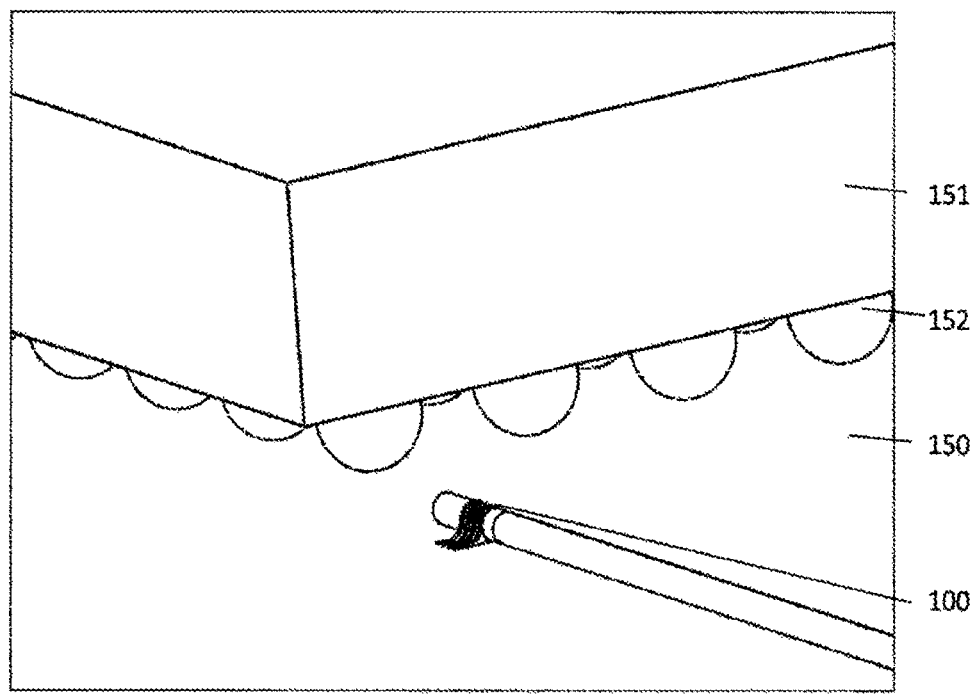
FIG. 1D is a diagram for describing a communication device including the photoelectric fiber according to the first embodiment of the present invention.
Figure 1E:
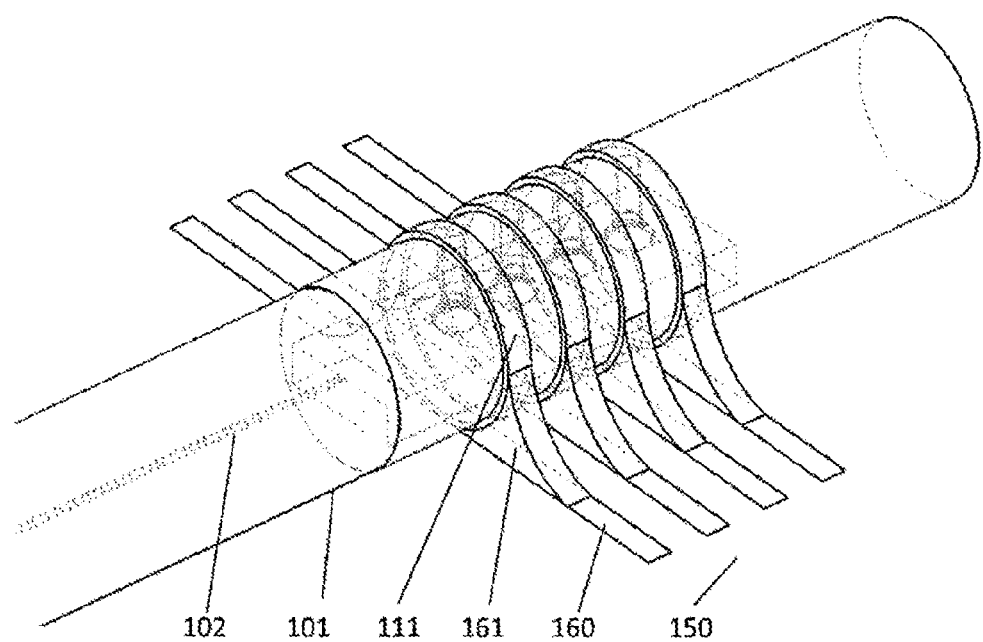
FIG. 1E is a diagram for describing the communication device including the photoelectric fiber according to the first embodiment of the present invention.

FIGS. 1D and 1E illustrate example configurations of a communication device using the photoelectric fiber 100. Note that the display of various electrode patterns and wiring on a printed circuit board 150 is omitted.

The communication device includes the printed circuit board 150, a communication LSI 151 mounted on the printed circuit board 150, a printed circuit board electrode 160 formed on the printed circuit board 150 and wiring (not illustrated) for connecting the printed circuit board electrode 160 and the communication LSI 151, and the photoelectric fiber 100 connected to the electrode 160 and electrically connected to the communication LSI 151 via wiring. Note that the printed circuit board electrode 160 is connected to the input/output terminals for the electrical signal of the communication LSI 151 and is connected to a power supply supplied from the other portion of the printed circuit board 150.

As shown in FIGS. 1D and 1E, the communication LSI 151 is electrically connected on the printed circuit board 150 via solder balls 152. The external electrode 111 of the photoelectric fiber 100 is connected to the printed circuit board electrode 160 of the printed circuit board 150 by a solder 161, and the photoelectric fiber 100 and the communication LSI 151 are connected to each other via wiring not illustrated in the drawings.

Here, the LSI 151 is, for example, a 20 mm square Ball Grid Array (BGA) package, and the solder balls 152 are formed, for example, into 0.45 mm spheres. When the external diameter of the photoelectric fiber 100 is approximately 125 um, in particular, the electrical unit 110 of the photoelectric fiber 100 is smaller than the LSI 151, so it is possible to dispose the photoelectric fiber 100 in the vicinity of the LSI, for example, within 1 mm.

By disposing the photoelectric fiber 100 in the vicinity of the LSI 151 in this manner, the wiring connecting the photoelectric fiber 100 and LSI 151 can be shortened and, as a result, degradation of the electrical signal can be suppressed.

As illustrated in FIG. 1E, the printed circuit board electrode 160 formed on the printed circuit board 150 and the external electrode 111 are connected to each other by forming a fillet with solder 161. By fixing the photoelectric fiber 100 to the printed circuit board with a fixing member not illustrated in the drawings, it is possible to mount the photoelectric fiber 100 together with other components by performing solder reflow in the same process as for the LSI 151 and normal electronic components. In the photoelectric fiber 100, the connection between optical components requiring alignment accuracy within 1 um or less (for alignment of the core 102 and the chip 113) has already been completed in the photoelectric fiber 100.

When mounted on the printed circuit board 150, the external electrode 111 of the photoelectric fiber 100 may simply be electrically connected to the printed circuit board electrode 160, so the alignment accuracy is sufficiently approximately 10 um, and the mounting process is simplified.

Manufacturing Method

Next, a method of manufacturing the photoelectric fiber 100 according to the present embodiment will be described with reference to FIGS. 2A to 2E.

Figure 2A:
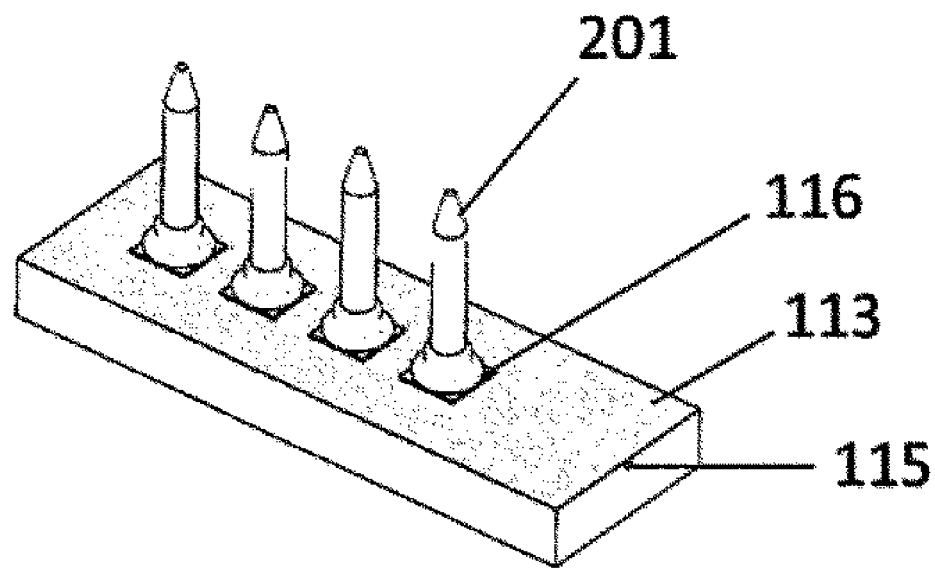
FIG. 2A is a diagram for describing the manufacturing process of the photoelectric fiber according to the first embodiment of the present invention.

First, a normal Au wire is subjected to ultrasonic crimping using a wire bonding device on the pad 116 of the chip 113 to form a stud bump 201, and the wires are cut at a suitable length (FIG. 2A). This is repeated for each pad to create a plurality of stud bumps 201.

Figure 2B:
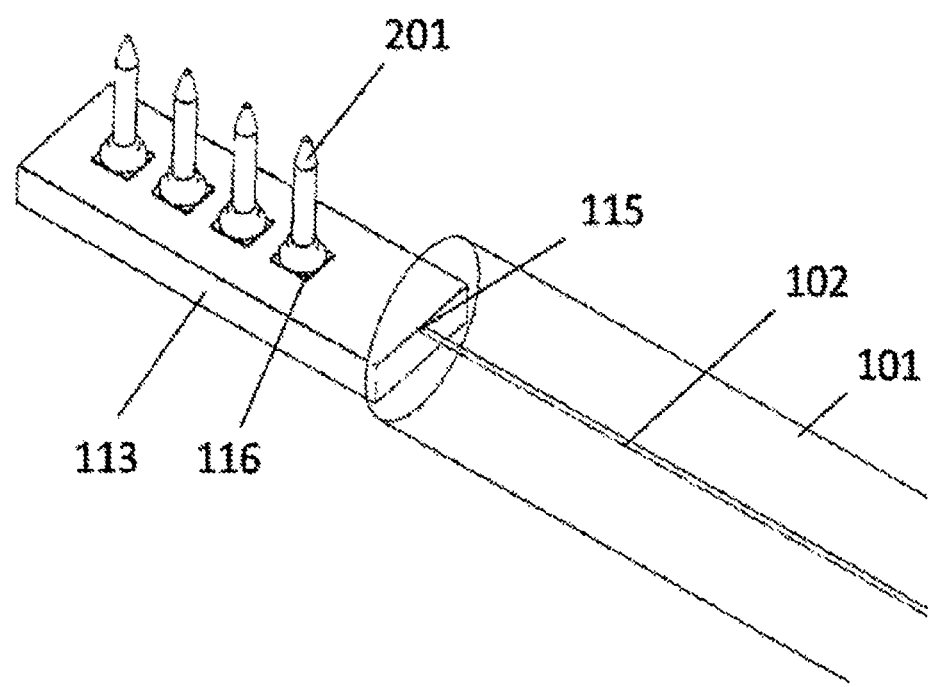
FIG. 2B is a diagram for describing the manufacturing process of the photoelectric fiber according to the first embodiment of the present invention.

Next, the optical input/output unit 115 provided on the side surface (chip end surface) of the chip 113 is optically aligned and connected with the core 102 (FIG. 2B). For example, the alignment may be performed by making light incident from the core 102 and monitoring the separation of the light reflected from the chip 113 and the optical input/output unit 115 and the incident light via an isolator or the like. In addition, in order to connect the optical input/output unit 115 of the chip 113 and the core 102 of the fiber 101, an indirect bonding using an adhesive made of resin may be performed, or in a case where the chip 113 is a highly resistant electrical device made of silicon, it may be connected by direct bonding, such as anodic bonding.

Figure 2C:
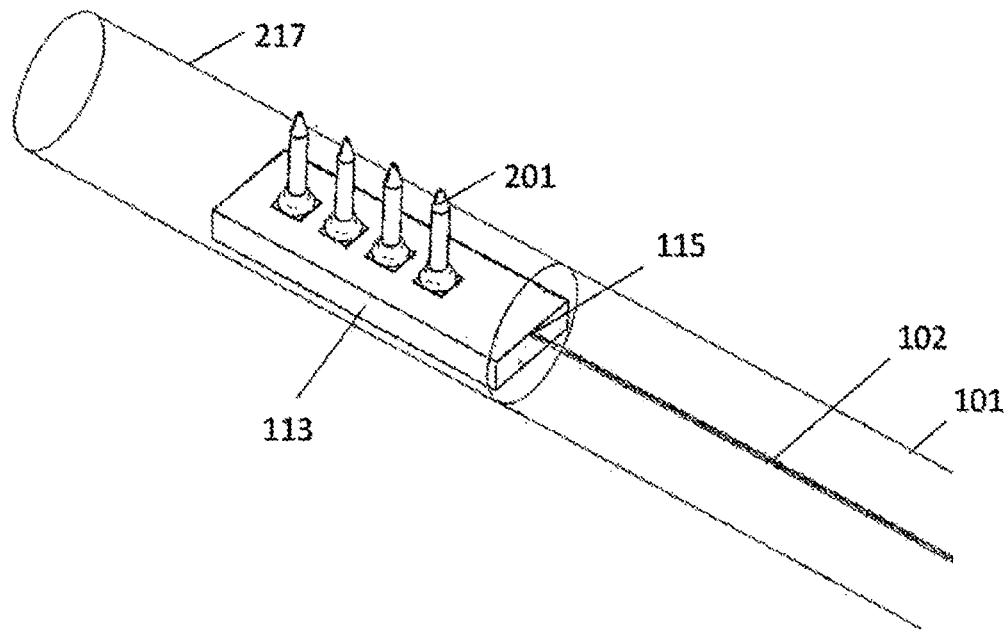
FIG. 2C is a diagram for describing the manufacturing process of the photoelectric fiber according to the first embodiment of the present invention.

Next, a cylindrical container 217 containing the resin that forms the filling unit 117 is prepared, and the chip 113 connected to the end surface of the fiber and the stud bumps 201 are immersed in the cylindrical container 217, and the resin is cured by heat or the like (FIG. 2C). At this point, the stud bumps 201 may protrude from the resin, or the shape of the resin itself may not be a clean cylindrical shape.

Figure 2D:
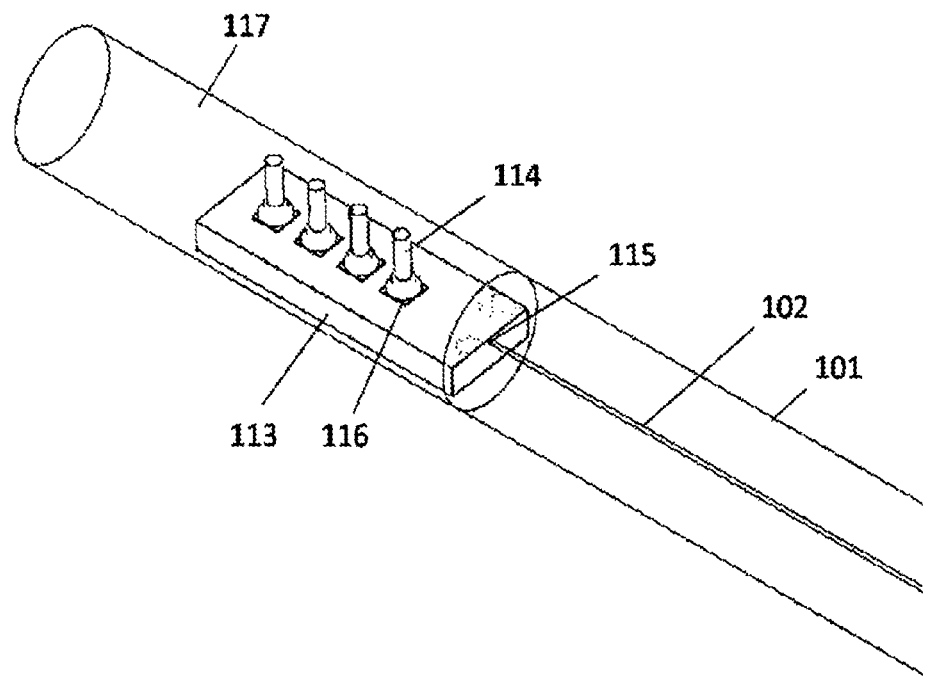
FIG. 2D is a diagram for describing the manufacturing process of the photoelectric fiber according to the first embodiment of the present invention.

After curing the resin, the outer diameter is cut and polished by a small lathe to form the filling unit 117 into a clean cylindrical shape (FIG. 2D). In this forming process, the tip portions of the stud bumps 201 are also cut, resulting in the wiring 114 including a metal portion exposed from the sealing member that forms the filling unit 117. Thereafter, the front surface of the filling unit 117 is masked by tape, resist, or the like, and then metal vapor deposition is performed to form the external electrode 111 electrically connected to the wiring 114 (FIG. 2E).

Figure 2E:
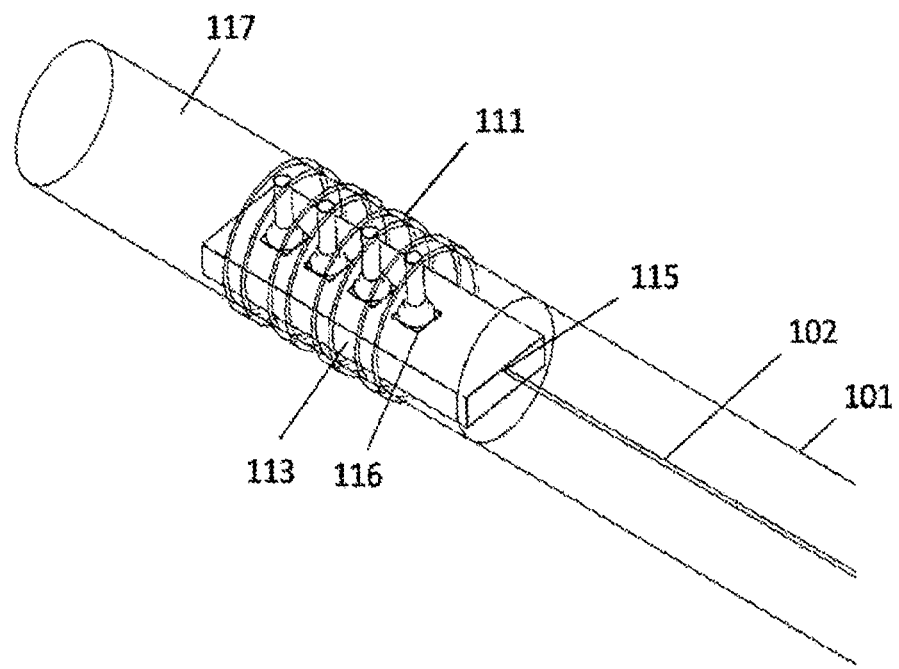
FIG. 2E is a diagram for describing the manufacturing process of the photoelectric fiber according to the first embodiment of the present invention.

Note that by configuring the external electrode 111 to have a circumferential shape, the vapor deposition process of FIG. 2E is simplified, and there is an advantage in that rotational alignment is unnecessary even in the process of connecting to the board illustrated in FIG. 1E. The photoelectric fiber 100 is manufactured via the process described above.

Effect of First Embodiment

When the optical signal that is guided through the core 102 is a high-speed signal of 100 Gbps, for example, the electrical signal converted by the chip 113 is a high-frequency signal of approximately 100 GHz. The higher the frequency of the electrical signal, the higher the transmission loss in the electrical wiring, causing more signal deterioration or interference between adjacent wiring. Thus, it is necessary that the electrical wiring be made as short as possible.

In the structure illustrated in FIG. 1B, the pad 116 of the chip 113 and the external electrode 111 are connected at the shortest distance via the wiring 114 extending in the radial direction of the cylindrical filling unit 117.

In known techniques, the chip is connected to the outside using a bonding wire or bumps for a flip-chip connection from the pads 116 of the chip 113, but in such a connection, the plane of the chip 113 and the plane of the external printed circuit board are connected, and the distance must also be made long. In contrast, in the photoelectric fiber 100 of the present embodiment, the electrode 111 is a three-dimensional electrode corresponding to the cylindrical shape of the fiber 101, and the chip 113 is disposed on the inside of the three-dimensional electrode, allowing for minimal electrical wiring. As a result, there is no deterioration of the electrical signal due to loss or interference, and high-speed signals can be transmitted.

In addition, in the present embodiment, the chip 113 is housed within the cylindrical electrical unit 110 having the same outer diameter as the outer diameter of the fiber 101, and only the external electrode 111 is placed outside of the fiber 101 and the electrical unit 110. Accordingly, the photoelectric fiber 100 can be made smaller to a size similar to that of the fiber 101, micro alignment of the optical component is not necessary, and the photoelectric fiber 100 can be used for rough alignment of an electrical components. These advantages can be obtained.

Modification Example of First Embodiment

In the photoelectric fiber 100 described above, when the length of the cylindrical electrical unit 110 is extended along the axis thereof, a plurality of chips 113 can be disposed within the electrical unit 110, and more pads and electrodes can be provided.

In addition, naturally, the fiber 101 can be used as a multi-core fiber, can be used for both transmission and reception using a plurality of cores, and can transmit in parallel using multiple cores of one fiber to increase capacity.

Figure 3:
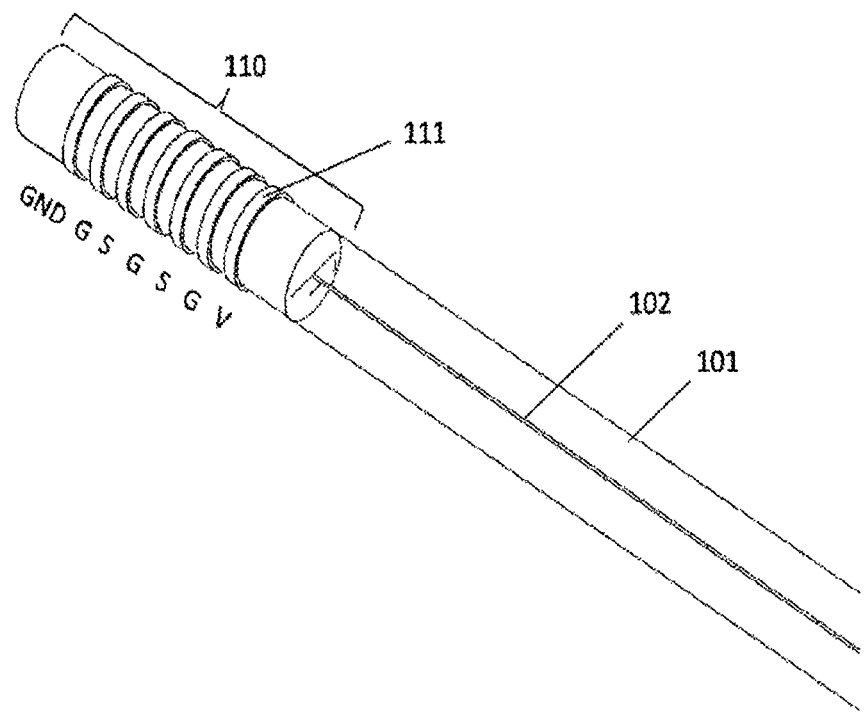
FIG. 3 is a diagram illustrating a modification example of the photoelectric fiber according to the first embodiment of the present invention.

Also, as illustrated in FIG. 3, for the external electrode 111, signal grounds (denoted as G) may be formed so as to sandwich a single ended signal line (denoted as S) from both ends, and a power supply (V) and a power supply ground (GND) may be provided. By disposing the power supply (V) on the optical fiber side on the end side of the power supply ground (GND), it is possible to protect the signal line (s) from external noise.

Second Embodiment

Figure 4A:
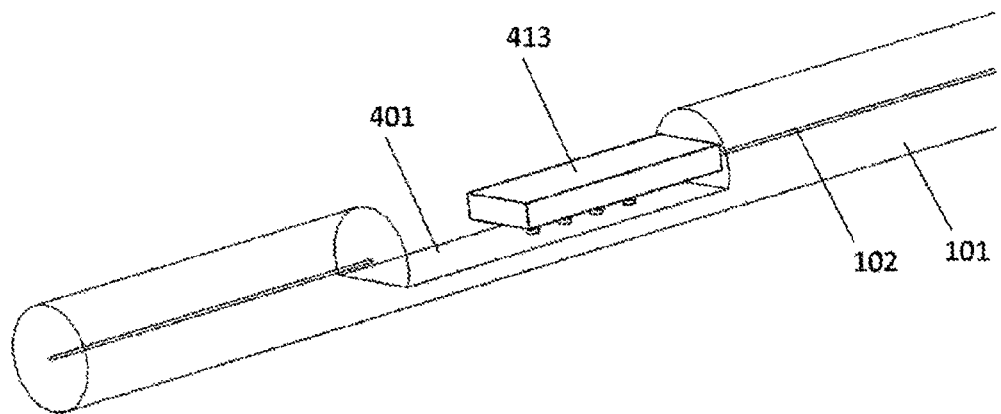
FIG. 4A is a diagram for describing the configuration of a photoelectric fiber according to a second embodiment of the present invention.

Next, a photoelectric fiber according to the second embodiment of the present invention will be described with reference to FIGS. 4A to 4C. Note that the same reference signs are used for the constituent elements common with the first embodiment, and detailed descriptions thereof will be omitted.

In the photoelectric fiber 100 according to the first embodiment, as illustrated in FIG. 1A and the like, the chip 113 is connected to the end surface of the optical fiber 101 only on the side surface on which the optical input/output unit 115 is provided. In contrast, a photoelectric fiber 400 according to the second embodiment further includes a support member formed integrally with the fiber 101 and having a flat surface that supports a chip 413. Specifically, as illustrated in FIGS. 4A and 4B, a portion of the cladding of the optical fiber 101 is removed to form a terrace 401 having a flat surface. By mounting the chip 413 on the terrace 401, a portion of the fiber 101 acts as a support member that supports the chip 413.

Figure 4B:
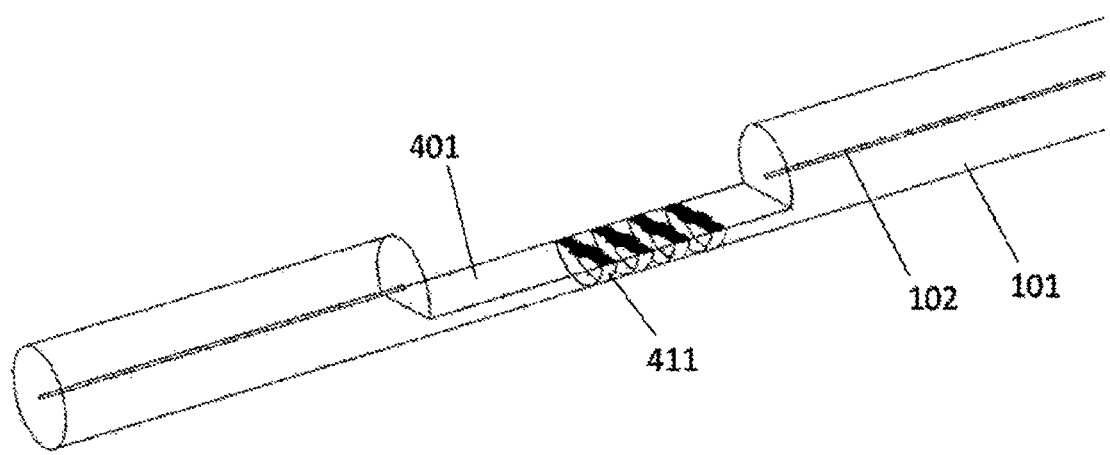
FIG. 4B is a diagram for describing the configuration of the photoelectric fiber according to the second embodiment of the present invention.

In this example, as illustrated in FIG. 4B, the photoelectric fiber may have a structure in which an external electrode 411 is formed on the terrace 401 and the chip 413 mounted on the terrace 401 is connected to the external electrode 411 by a flip-chip. The external electrode 411, at a portion formed on the cylindrical side opposite of the terrace 401, connects with the printed circuit board electrode 160 formed on the printed circuit board 150, for example, as illustrated in FIG. 1E.

Figure 4C:
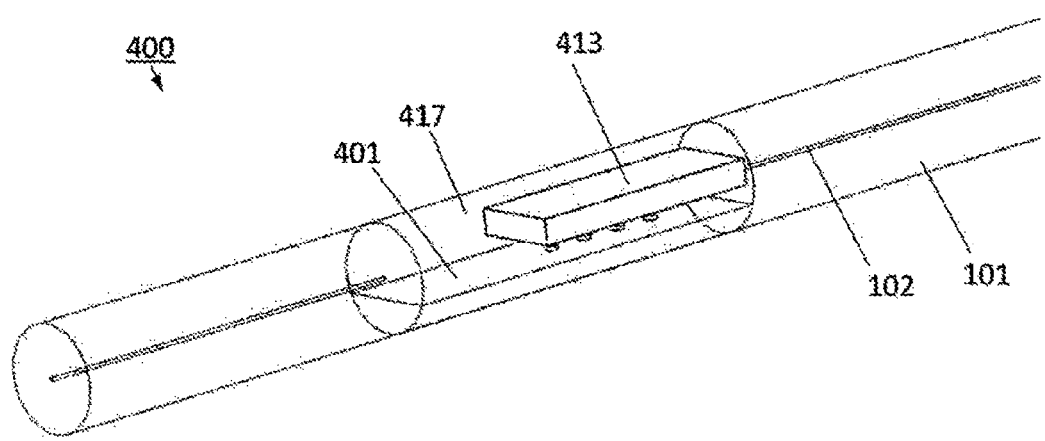
FIG. 4C is a diagram for describing the configuration of the photoelectric fiber according to the second embodiment of the present invention.

Furthermore, as illustrated in FIG. 4C, the chip 413 mounted on the terrace 401 may be configured to be protected and reinforced by a filling unit 417 made from resin.

According to the present embodiment, because the chip 413 is supported by the terrace 401, the strength of the structure can be increased compared to the structure of the photoelectric fiber according to the first embodiment.

Third Embodiment

Next, the third embodiment of the present invention will be described with reference to FIG. 5.

In the first embodiment described above, as illustrated in FIG. 1A and the like, the pad 116 of the chip 113 is formed on the top surface of the chip 113, and the optical input/output unit 115 that optically connects to the core 102 of the fiber 101 is formed on the side surface of the chip 113 that connects to the top surface on which the pad 116 is formed. In contrast, in the photoelectric fiber according to embodiments of the present invention, the pad and the optical input/output unit may be provided on the same surface of the chip or on mutually parallel surfaces.

Figure 5:
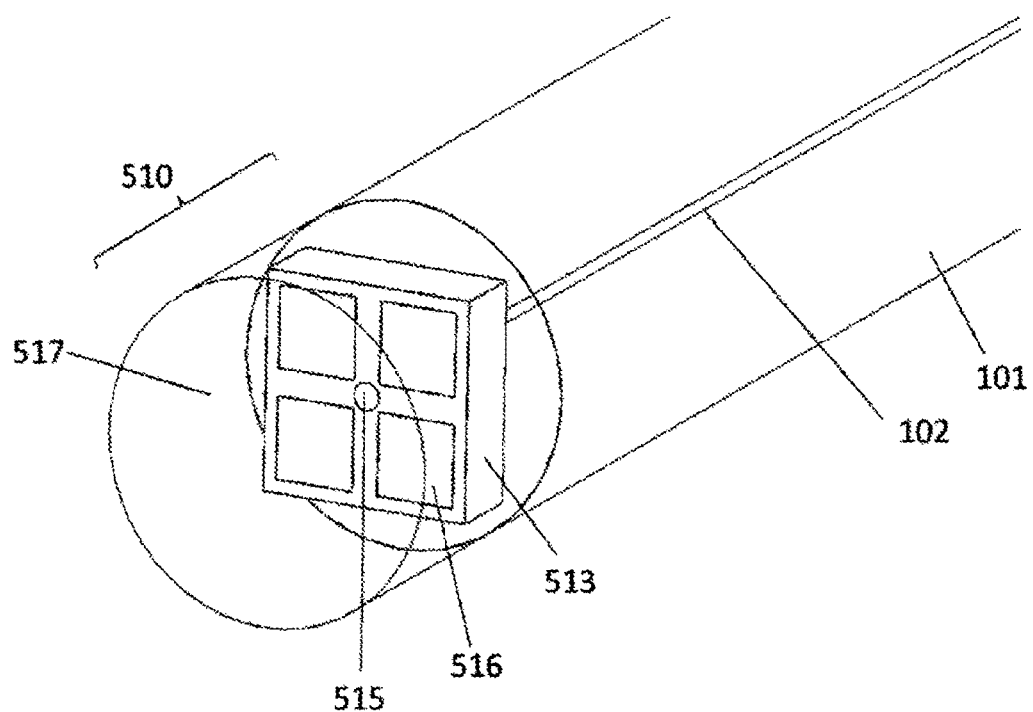
FIG. 5 is a diagram for describing the configuration of a photoelectric fiber according to a third embodiment of the present invention.

For example, as illustrated in FIG. 5, a chip 513 may be provided with an optical input/output unit 515 and a pad 516 on the same front surface of the chip 513, or the optical input/output unit 515 may be provided on a rear surface opposite to the front surface on which the pad 516 is provided. Examples of the chip 513 with the optical input/output unit 515 and the pad 516 provided on the front surface of the chip 513 include a vertical cavity surface emitting laser, a rear surface incident type photodetector, and the like.

The photoelectric fiber according to the present embodiment employs the chip 513 described above. For example, in a case where the chip 513 is a rear surface incident type photodetector, light is incident from the rear surface side on the opposite side to the pad 516, expands and is received by the optical input/output unit 515 on the front surface. With the light receiving unit and the core 102 of the fiber 101 in optical alignment, as illustrated in FIG. 5, the external shape of an electrical unit 510 is formed into a cylindrical shape by a filling unit 517.

Although not illustrated, in the description of the first embodiment, in the same steps as described with reference to FIGS. 2A to 2C, at the time the stud bumps are formed, the tip portion of the wire erected on the pad can be bent to form electrical wiring exposed from the filling unit 517 to the outside.

According to the present embodiment, by such way, the photoelectric fiber 100 can be realized regardless of the surface relationship between the optical input/output unit and the pad.

Fourth Embodiment

Next, a photoelectric fiber according to the fourth embodiment of the present invention will be described with reference to FIGS. 6A and 6B.

In the photoelectric fiber 100 according to the first embodiment described above, as illustrated in FIG. 1B and the like, the wiring 114 is provided erected on the pad 116 to form a three-dimensional structure that is separated from the fiber 101. However, the wiring connecting the pad and the external electrode may be formed on the front surface of the fiber.

With the photoelectric fiber according to the present embodiment, it is expected that, as illustrated in FIG. 5, the chip 513 including the optical input/output unit 515 and the pad 516 on the same front surface, such as VCSEL, is used to dispose the surface on which the optical input/output unit 515 and the pad 516 of the chip 513 is formed facing the end surface of the fiber 101. In the present embodiment, as illustrated in FIG. 6A, an external electrode 611, a pad 616 made of metal, and wiring 614 connecting the pad 616 and the external electrode 611 are formed on the front surface of the fiber 101. Note that in FIGS. 6A and 6B, the photoelectric conversion unit including the chip 513 is omitted.

In the present embodiment, the external electrode 611 is the same as in the first embodiment in that it is a circular shape, but in the first embodiment, the external electrode 111 is formed on the front surface of the electrical unit 110, and in the present embodiment, the external electrode 611 is formed on the front surface of the fiber 101. As illustrated in FIGS. 6A and 6B, the pad 616 is formed on the end surface of the optical fiber 101 and is connected to the pad 516 of the chip 513, for example, as illustrated in FIG. 5, disposed opposite the end surface.

Figure 6A:
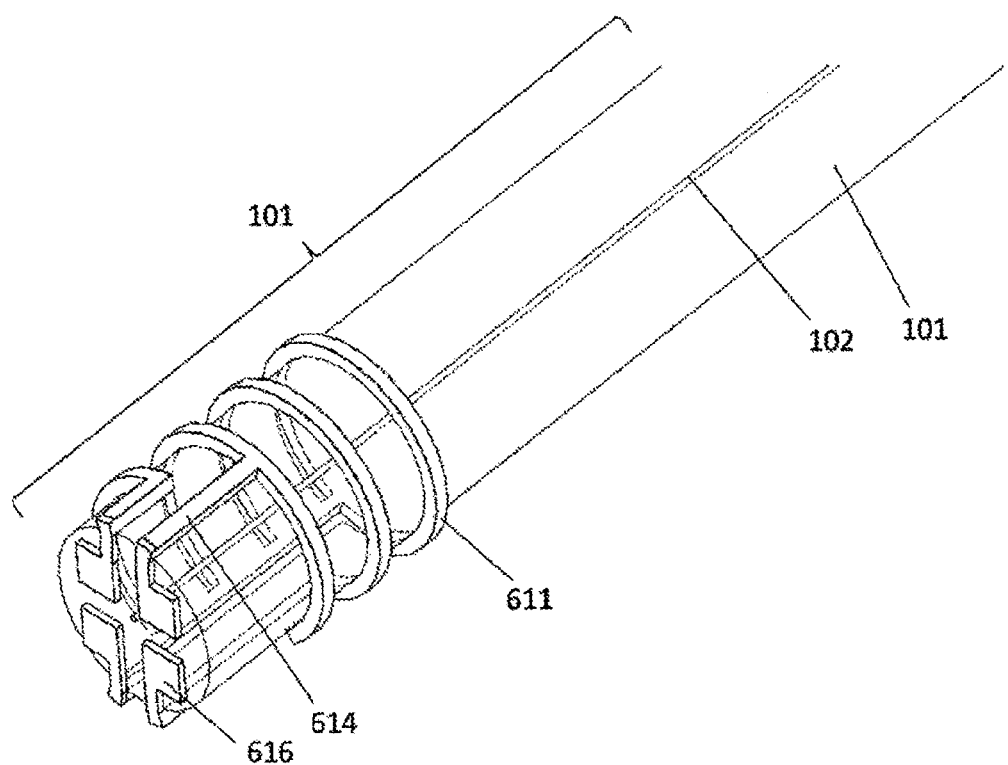
FIG. 6A is a diagram for describing the configuration of a photoelectric fiber according to a fourth embodiment of the present invention.

Furthermore, as illustrated in FIG. 6A, the wiring 614, together with the metal pad 616 described above, is formed in continuous three-dimensional shape on the front surface of the fiber 101. Here, a 90-degree bent-back portion where the end surface of the fiber 101 transitions to the side surface is set to an appropriate thickness so that the wiring does not break. The pad 616, the wiring 614, and the external electrode 611 with such a configuration may be formed by vapor deposition, plating, or the like.

Figure 6B:
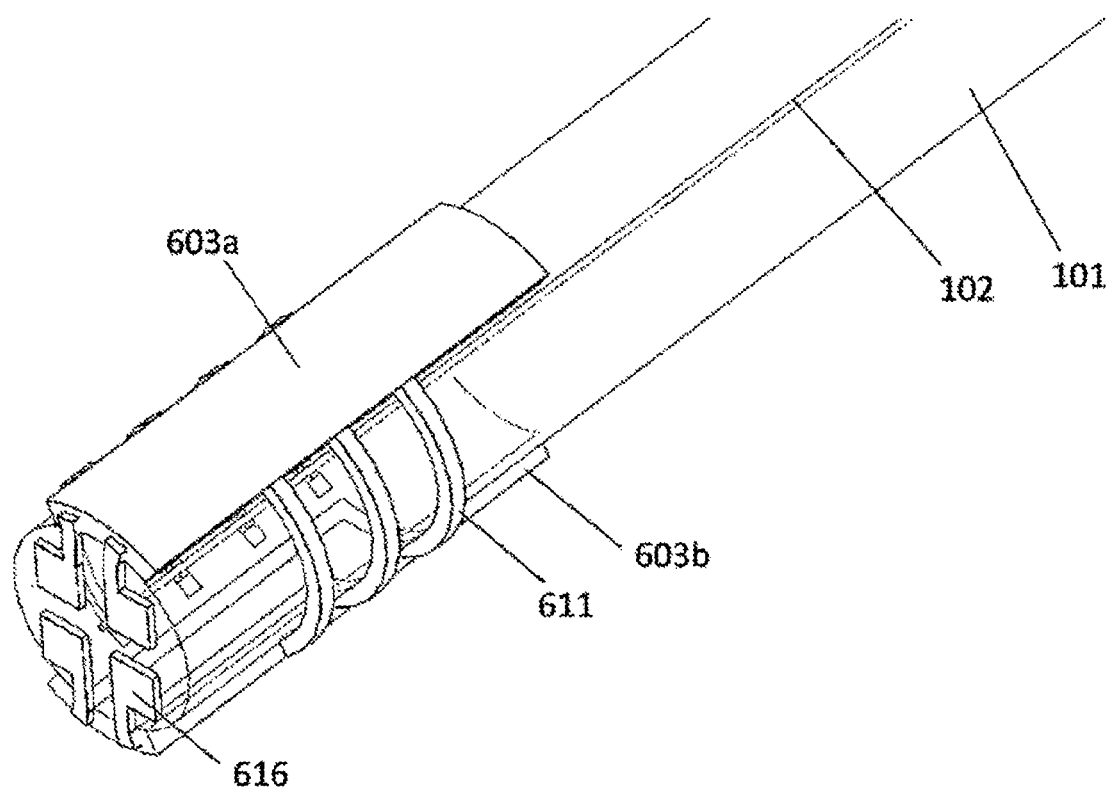
FIG. 6B is a diagram for describing the configuration of the photoelectric fiber according to the fourth embodiment of the present invention.

After forming the pad 616, the wiring 614, and the external electrode 611, as illustrated in FIG. 6B, insulating films 603a, 603b may be formed in parts to protect the wiring 614 formed on the side surface of the fiber 101 and the connection portion between the wiring 614 and the external electrode 611. By providing the insulating films 603a, 603b in this manner, even in a case where the fiber 101 is rotated about an axis when mounted on the printed circuit board 150 as illustrated in FIG. 1E, it is possible to prevent a short circuit between the different pads.

In the present embodiment, the external electrode 611 is formed to be in contact the front surface of the fiber 101, and thus, the external electrode 611 can be formed before the chip 513 is mounted on the fiber 101. Thus, compared to the first embodiment described above in which the process of forming the external electrode 111 takes place after optical connection between the core 102 of the fiber 101 and the chip 113, the present embodiment has an advantage in that the external electrode 611 can be formed prior to mounting the chip 513 to reduce the load from the process after the core 102 of the fiber 101 and the chip 513 are optically connected.

Fifth Embodiment

Next, a photoelectric fiber according to the fifth embodiment of the present invention will be described with reference to FIGS. 7A and 7B.

Figure 7A:
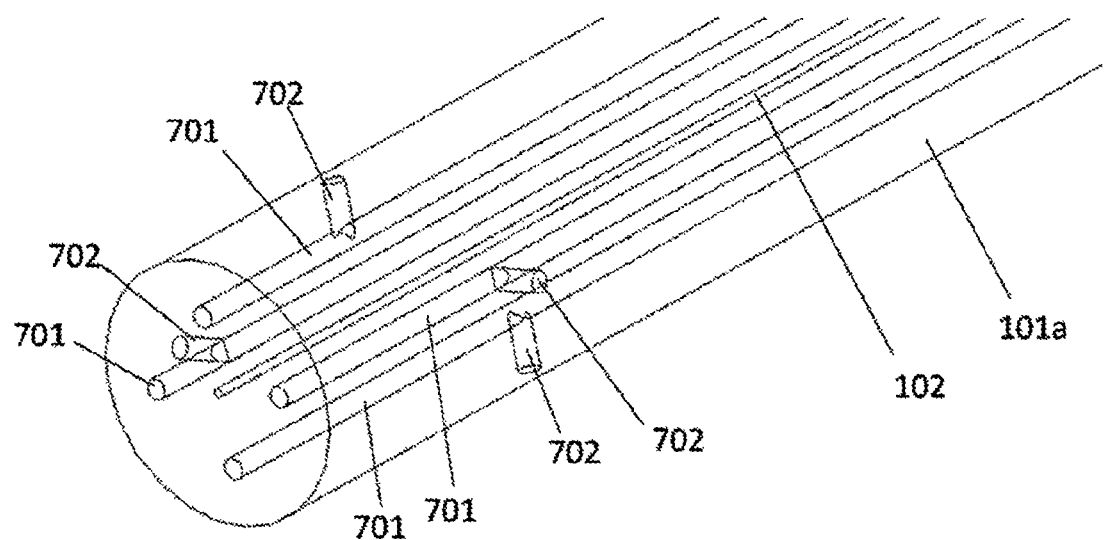
FIG. 7A is a diagram for describing the configuration of a photoelectric fiber according to a fifth embodiment of the present invention.
Figure 7B:
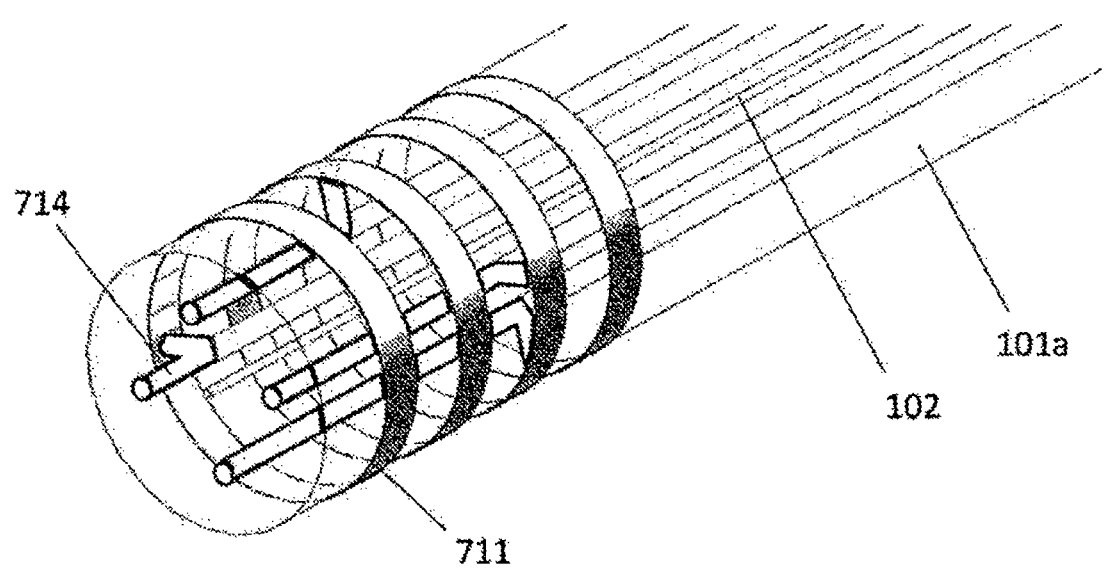
FIG. 7B is a diagram for describing the configuration of the photoelectric fiber according to the fifth embodiment of the present invention.
Figure 8:
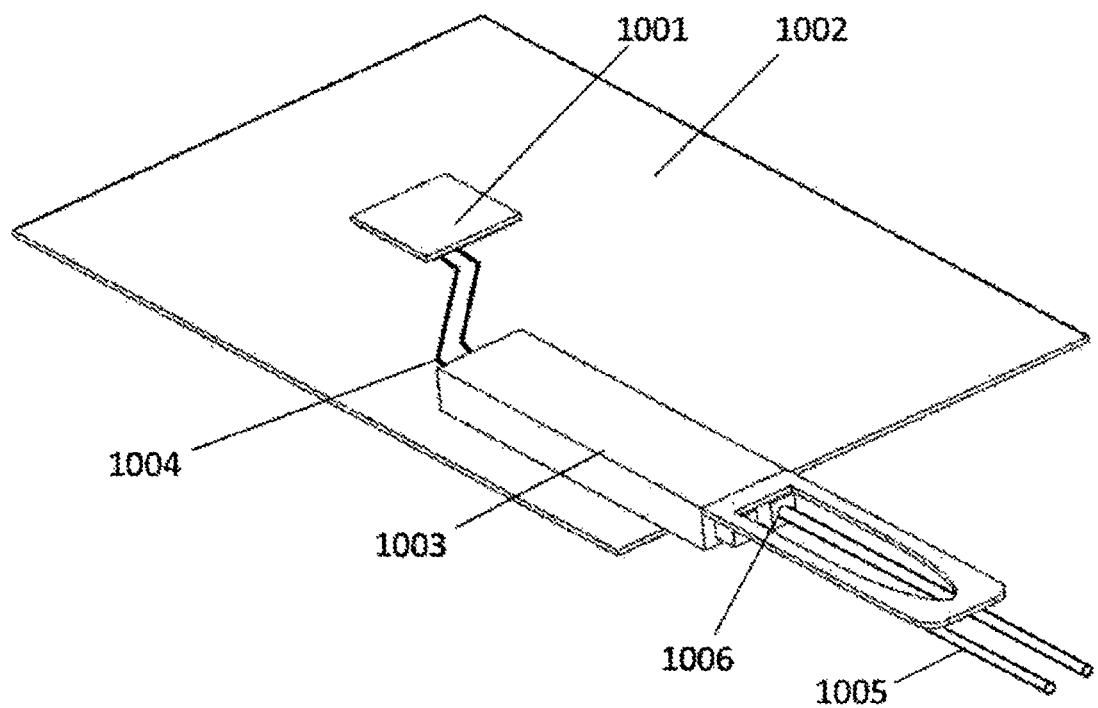
FIG. 8 is a diagram for describing a known communication device.

In the fourth embodiment described above, the wiring 614 is formed on the front surface of the fiber 101, while in the present embodiment, as illustrated in FIG. 7A, the wiring connecting with an external electrode 711 is formed through the interior of the fiber 101 as internal wiring 714. Note that in FIGS. 7A and 7B, a photoelectric conversion unit including the chip is omitted.

The electrode structure as described above can be obtained using a hole structure fiber 101a as illustrated in FIG. 7A as follows.

First, the hole structure fiber 101a is prepared. The hole structure fiber 101a includes, in addition to the core 102, a plurality of horizontal holes 701 (four in FIG. 7A). The horizontal holes 701 are spaces formed in the cladding portion of the fiber 101a parallel to the core 102.

Next, in the fiber 101a, a plurality of vertical holes 702 (four in FIG. 7A) are formed with one end connected to the horizontal holes 701 and the other end opening to the front surface of the fiber 101a. The vertical holes 702 with such a configuration can be formed by processing the fiber 101a using a laser or the like. As illustrated in FIG. 7A, the plurality of vertical holes 702 are formed at different positions along the axial direction of the fiber 101a.

After the vertical holes 702 are formed, an electrode (circumferential electrode) is formed on the side surface of the fiber 101a in the circumferential direction. Such a circumferential electrode can be formed, for example, by forming a resist pattern on the side surface of the fiber 101a and performing vapor deposition with an Au mask and an Ni base. The circumferential electrode is formed including four opening portions for the four vertical holes 702. As a result, a total number of four circumferential electrodes are formed in a striped shape on the side surface of the fiber 101a.

Next, the end of the fiber 101a is turned downward and immersed in the molten solder to fill the openings of the horizontal holes 701, and the air pressure is reduced while the vertical holes 702 are open. Then, the inside of the horizontal holes 701 are filled with solder, and reducing the air pressure is stopped in a state where the solder flows out of the vertical holes 702 that opens to the side surface of the fiber 101a, and the temperature is lowered to room temperature by pulling the fiber 101a up from the molten solder. At this time, because solder has high wettability with Au and poor wettability with glass base, some of the solder overflowing from the vertical holes 702 spreads over the Au of the circumferential electrode described above, while the solder does not attach to the front surface of the cladding of the fiber 101a where the circumferential electrode is not formed. In this manner, the external electrode 111, which is selectively formed in correspondence with the circumferential electrode, and the internal wiring 714 connected to the external electrode 111 through the horizontal holes 701 and the vertical holes 702 are formed.

Thereafter, when mounting the chip 513 as illustrated in FIG. 5, the solder balls and the like may be mounted in advance on the chip, and the internal wiring 714 exposed at the end surface of the fiber 101a and the solder may be connected to each other.

As described above, because the internal wiring 714 is formed through the interior of the fiber 101a, the external electrode 111 can be formed before the chip is mounted. Accordingly, as in the fourth embodiment, the load caused by the process after the optical connection of the core 102 of the fiber 101a and the chip 513 can be reduced. Moreover, because the wiring passes through the interior of the fiber 101a, the wiring and the external electrode cause no undulation and the outer diameter of the fiber 101a can be formed closer to that of a perfect circle.

Note that in the first to fifth embodiments described above, an example has been described in which the filling unit which constitutes the electrical unit together with the chip is formed into a cylindrical shape and has approximately the same diameter as the fiber. However, the filling unit does not need to necessarily be cylindrical and may be, for example, formed into a prismatic shape. Furthermore, the filling unit does not need to necessarily have the same diameter as the fiber and may be formed thicker than the fiber, for example. Also, as long as the external electrode can be formed on the front surface of the filling unit or the fiber and can connect to the outside, an aspect in which the end portion of the fiber is installed inside the filling unit together with the chip is also included in forming the electrical unit continuously with the fiber.

INDUSTRIAL APPLICABILITY

Embodiments of the present invention can be used in the field of optical communication, optical sensing, and other processes involving transmission of optical signals and photoelectric conversion.

REFERENCE SIGNS LIST

101 Fiber
102 Core
110 Electrical unit
111 External electrode
113 Photoelectric conversion chip
114 Wiring
115 Optical input/output unit
117 Filling unit.

The invention claimed is:

1. A photoelectric fiber, comprising: a fiber including a core, the fiber being configured to guide light through the core; an electrical device continuous with the fiber, the electrical device being configured to house a photoelectric conversion chip including a photoelectric conversion element; and an external electrode on a front surface the fiber or the electrical device, wherein the photoelectric conversion chip is optically connected to the core and electrically connected to the external electrode, wherein the photoelectric conversion chip includes: an electrode pad on a first surface of the photoelectric conversion chip, the electrode pad being configured to electrically connect to the external electrode; and an optical input/output on the first surface or a second surface parallel with the first surface, the optical input/output being configured to optically connect to the core.

2. The photoelectric fiber according to claim 1, wherein the photoelectric conversion chip includes:
an electrode pad on a first surface of the photoelectric conversion chip, the electrode pad being configured to electrically connect to the external electrode; and
an optical input/output provided on a side surface connecting to the first surface, the optical input/output being configured to optically connect to the core.

3. The photoelectric fiber according to claim 2, wherein the electrical device further includes a support member integral with the fiber, the support member being configured to support the photoelectric conversion chip.

4. The photoelectric fiber according to claim 1, further comprising wiring configured to connect the external electrode and the electrode pad, wherein the electrical device further includes a filling structure made from an insulator configured to seal the photoelectric conversion chip and the wiring.

5. The photoelectric fiber according to claim 1, further comprising wiring configured to connect the external electrode and the electrode pad, wherein the external electrode is disposed on the front surface of the fiber, and the wiring is disposed on the front surface of the fiber.

6. The photoelectric fiber according to claim 1, further comprising wiring configured to connect the external electrode and the electrode pad, wherein the external electrode is disposed on the front surface of the fiber, and at least a portion of the wiring extend through an interior of the fiber.

7. A communication device, comprising:
a printed circuit board;
an integrated circuit mounted on the printed circuit board;
an electrode on the printed circuit board;
wiring configured to connect the electrode and the integrated circuit; and
a photoelectric fiber electrically connected to the integrated circuit via the wiring, wherein the photoelectric fiber comprises:
a fiber including a core, the fiber being configured to guide light through the core;
an electrical device continuous with the fiber, the electrical device being configured to house a photoelectric conversion chip including a photoelectric conversion element; and
an external electrode on a front surface the fiber or the electrical device, wherein the photoelectric conversion chip is optically connected to the core and electrically connected to the external electrode, and wherein the external electrode is connected to the integrated circuit via the electrode on the printed circuit board and the wiring.

8. The communication device according to claim 7, wherein the photoelectric conversion chip includes:
an electrode pad on a first surface of the photoelectric conversion chip, the electrode pad being configured to electrically connect to the external electrode; and
an optical input/output on the first surface or a second surface parallel with the first surface, the optical input/output being optically connect to the core.

9. The communication device according to claim 8, wherein the photoelectric conversion chip includes:
an electrode pad on a first surface of the photoelectric conversion chip, the electrode pad being configured to electrically connect to the external electrode; and
an optical input/output provided on a side surface connecting to the first surface, the optical input/output being optically connect to the core.

10. The communication device according to claim 9, wherein the electrical device further includes a support member integral with the fiber, the support member being configured to support the photoelectric conversion chip.

11. The communication device according to claim 10, further comprising wiring configured to connect the external electrode and the electrode pad, wherein the electrical device further includes a filling structure made from an insulator configured to seal the photoelectric conversion chip and the wiring.

12. The communication device according to claim 8, further comprising wiring configured to connect the external electrode and the electrode pad, wherein the external electrode is disposed on the front surface of the fiber, and the wiring is disposed on the front surface of the fiber.

13. The communication device according to claim 8, further comprising wiring configured to connect the external electrode and the electrode pad, wherein the external electrode is disposed on the front surface of the fiber, and at least a portion of the wiring extend through an interior of the fiber.

\* \* \* \* \*